(12) United States Patent  (10) Patent No.: US 6,649,522 B2
Farrar  (45) Date of Patent: Nov. 18, 2003

(54) ETCH STOP IN DAMASCENE INTERCONNECT STRUCTURE AND METHOD OF MAKING

(75) Inventor: Paul A. Farrar, South Burlington, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/245,508

(22) Filed: Sep. 18, 2002

(65) Prior Publication Data

US 2003/0013292 A1 Jan. 16, 2003

Related U.S. Application Data

(60) Continuation of application No. 09/941,762, filed on Aug. 30, 2001, which is a division of application No. 09/653,562, filed on Aug. 31, 2000, now Pat. No. 6,395,632.

(51) Int. Cl.[7] .............................................. H01L 21/44
(52) U.S. Cl. ....................................... 438/687; 438/622
(58) Field of Search ................................. 438/622, 627, 438/634, 637, 638, 639, 641, 687, 692

(56) References Cited

U.S. PATENT DOCUMENTS

| 5,485,038 | A | 1/1996 | Licari et al. |
| 5,811,352 | A | 9/1998 | Numata et al. |
| 6,187,661 | B1 | 2/2001 | Lou |
| 6,211,561 | B1 * | 4/2001 | Zhao |
| 6,239,494 | B1 | 5/2001 | Besser et al. |
| 6,245,662 | B1 | 6/2001 | Naik et al. |

OTHER PUBLICATIONS

"Stopper–less Hybrid Low–K/Cu DD structure fabrication combined with Low–k CMP" by T. Usami et al., Proc. 2000 International Interconnect Technology Conference, pp. 250–252.

* cited by examiner

Primary Examiner—Phuc T. Dang
(74) Attorney, Agent, or Firm—Dickstein Shapiro Morin & Oshinsky LLP.

(57) ABSTRACT

An interconnect structure with a plurality of low dielectric constant insulating layers acting as etch stops is disclosed. The low dielectric constant materials act as insulating layers through which trenches and vias are subsequently formed by employing a timed etching. Since the low dielectric constant materials are selected so that the etchant available for each one has only a small etch rate relative to the other low dielectric constant materials, the plurality of low dielectric constant materials act as etch stops during the fabrication of interconnect structures. This way, the etch stop layers employed in the prior art are eliminated and the number of fabrication steps is reduced.

4 Claims, 10 Drawing Sheets

ETCH STOP IN DAMASCENE INTERCONNECT STRUCTURE AND METHOD OF MAKING

This application is a continuation of application Ser. No. 09/941,762, filed on Aug. 30, 2001, which in turn is a divisional of application Ser. No. 09/653,562, filed on Aug. 31, 2000 now U.S. Pat. No. 6,395,632 the entirety of each being incorporated by reference herein.

FIELD OF THE INVENTION

The present invention relates to semiconductor devices and methods of making such devices. More particularly, the invention relates to a method of providing an etch stop in damascene interconnect structures.

BACKGROUND OF THE INVENTION

The integration of a large number of components on a single integrated circuit (IC) chip requires complex interconnects. Ideally, the interconnect structures should be fabricated with minimal signal delay and optimal packing density. The reliability and performance of integrated circuits may be affected by the qualities of their interconnect structures.

Advanced multiple metallization layers have been used to accommodate higher packing densities as devices shrink below sub-0.25 micron design rules. One such metallization scheme is a dual damascene structure formed by a dual damascene process. The dual damascene process is a two-step sequential mask/etch process to form a two-level structure, such as a via connected to a metal line situated above the via.

Figure 1:
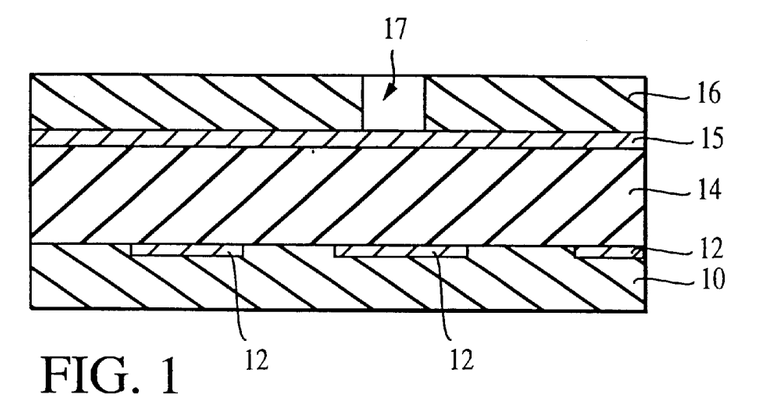
FIG. 1 is a cross sectional view of a semiconductor device at a preliminary stage of production.

As illustrated in FIG. 1, a known dual damascene process begins with the deposition of a first insulating layer 14 over a first level interconnect metal layer 12, which in turn is formed over or within a semiconductor substrate 10. A second insulating layer 16 is next formed over the first insulating layer 14. An etch stop layer 15 is typically formed between the first and second insulating layers 14, 16. The second insulating layer 16 is patterned by photolithography with a first mask (not shown) to form a trench 17 corresponding to a metal line of a second level interconnect. The etch stop layer 15 prevents the upper level trench pattern 17 from being etched through to the first insulating layer 14.

Figure 2:
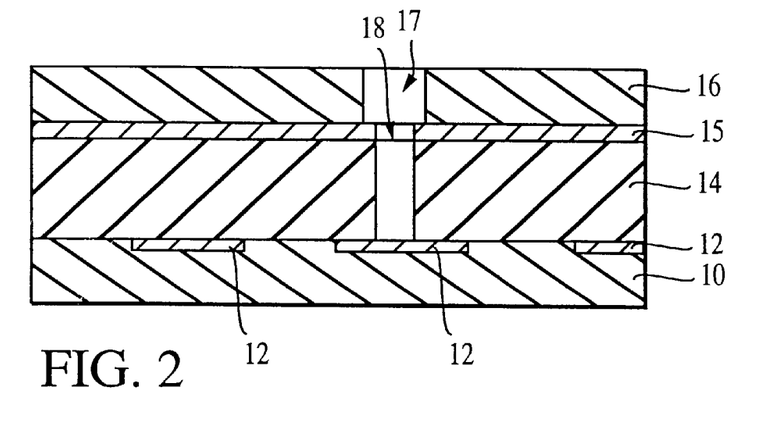
FIG. 2 is a cross sectional view of the semiconductor device of FIG. 1 at a subsequent stage of production.
Figure 3:
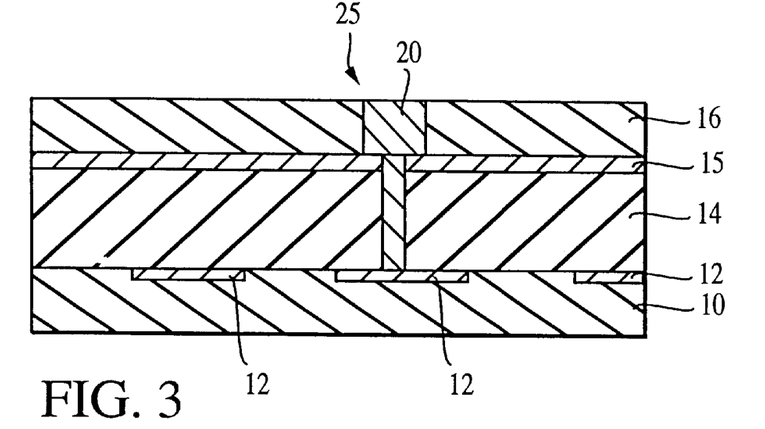
FIG. 3 is a cross sectional view of the semiconductor device of FIG. 2 at a subsequent stage of production.
Figure 4:
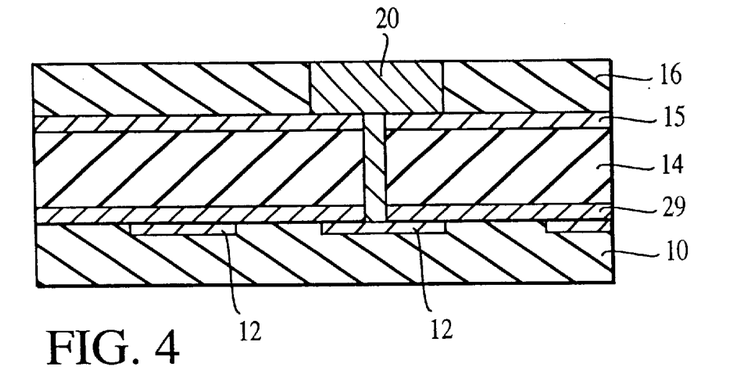
FIG. 4 is a cross sectional view of another semiconductor device.

As illustrated in FIG. 2, a second masking step followed by an etch step are applied to form a via 18 through the etch stop layer 15 and the first insulating layer 14. After the etching is completed, both the trench 17 and the via 18 are filled with metal 20, which is typically copper (Cu), to form a damascene structure 25, as illustrated in FIG. 3. If desired, a second etch stop layer, such as stop layer 29 of FIG. 4, may be formed between the substrate 10 and the first insulating layer 14 during the formation of a dual damascene structure 26.

Damascene processes such as the ones described above pose significant problems. One of the problems is caused by the use of one or more etch stop layers. The etch stop layers 15, 25 prevent the damascene patterns 17, 18 from extending into or through the underlying layers 14, 10. Although the advantages of using the etch stop layers are significant, the process is complex since separate depositions are required for the etch stop layers.

In addition, the most commonly used etch stop material, silicon nitride ($Si_3N_4$), has a rather high dielectric constant (k) (approximately 7), which does not satisfy anymore the requirement of resistance-capacitance delay regarding the parasitic capacitance generated by an intermetal insulating layer. As integrated circuits become denser, it is increasingly important to minimize stray capacitance between the metal layers. This is accomplished by using intermetal insulating layers that have a low dielectric constant, such as, for example, organic dielectric materials. Silicon nitride does not satisfy the requirement of small stray capacitance of advanced damascene structures.

Accordingly, there is a need for an improved damascene process which reduces production costs and increases productivity. There is also a need for a damascene process that does not require etch stop layers, as well as a method for decreasing the stray capacitance between the metal layers of damascene structures.

SUMMARY OF THE INVENTION

The present invention provides a method for fabricating a damascene multilevel interconnect structure in a semiconductor device. According to one aspect of the invention, the use of high dielectric etch stop material may be avoided, so as to reduce or minimize stray capacitance.

In an exemplary embodiment, a plurality of low dielectric constant materials are selected with similar methods of formation, as well as with similar capacities to withstand physical and thermal stress. The low dielectric constant materials act as insulating layers through which trenches and vias are subsequently formed by employing a timed etching. Since the low dielectric constant materials are selected so that the etchant available for each one has only a small etch rate relative to the other low dielectric constant materials, the plurality of low dielectric constant materials act as etch stops during the fabrication of damascene structures. This way, the etch stop layers employed in the prior art are eliminated and the number of fabrication steps is reduced.

Additional advantages of the present invention will be more apparent from the detailed description and accompanying drawings, which illustrate preferred embodiments of the invention.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has a semiconductor surface. The term should be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a "substrate" in the following description, previous process steps may have been utilized to form regions or junctions in or on the base semiconductor or foundation.

The term "metal" is intended to include not only elemental metal, but also metal with other trace metals or in various alloyed combinations with other metals as known in the art, as long as such alloy retains the physical and chemical properties of the metal.

The present invention provides a method for fabricating a damascene interconnect structure in which a plurality of low dielectric constant materials are selected with similar methods of formation, as well as with similar capacities to withstand physical and thermal stress, and through which metallization trenches and vias are formed by employing a timed etching.

Figure 5:
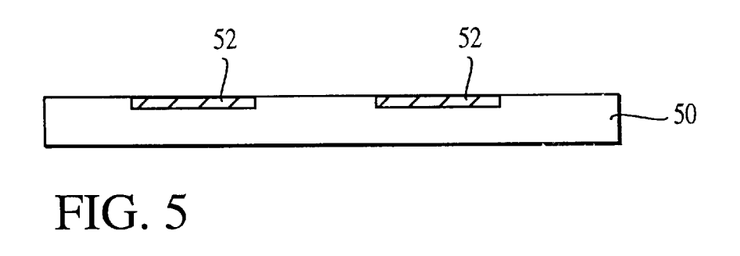
FIG. 5 is a cross sectional view of a semiconductor device at a preliminary stage of production and in accordance with a method of the present invention.

Referring now to the drawings, where like elements are designated by like reference numerals, FIG. 5 depicts a portion of a semiconductor substrate 50 on or within which a conducting layer 52 has been formed. The conducting layer 52 represents a lower metal interconnect layer or device level which is to be later interconnected with an upper metal interconnect layer. The conducting layer 52 may be formed of copper (Cu), but other conductive materials, such as tungsten (W) silver (Ag) gold (Au) or aluminum (Al) and their alloys, may be used also.

Figure 6:
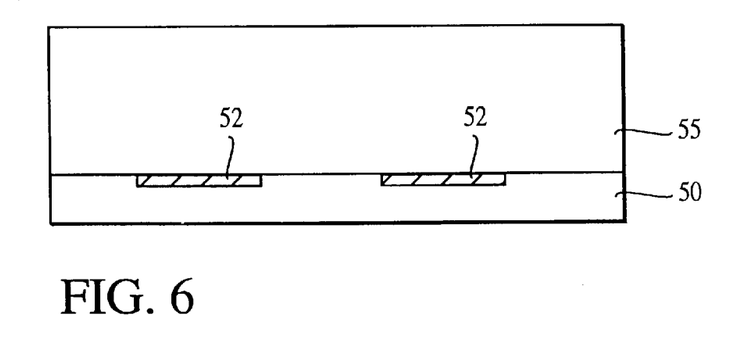
FIG. 6 is a cross sectional view of the semiconductor device of FIG. 5 at a subsequent stage of production.

Referring now to FIG. 6, a first intermetal insulating layer 55 is formed overlying the substrate 50 and the conducting layer 52. In a preferred embodiment of the present invention, the first intermetal insulating layer 55 is blanket deposited by spin coating to a thickness of about 4,000 Angstroms to 30,000 Angstroms, more preferably about 12,000 to 20,000 Angstroms. The first intermetal insulating layer 55 may be cured at a predefined temperature, depending on the nature of the material. Other known deposition methods, such as sputtering by chemical vapor deposition (CVD), plasma enhanced CVD (PECVD), or physical vapor deposition (PVD), may be used also for the formation of the first intermetal insulating layer 55, as desired. The first intermetal insulating layer 55 is desirably selected so that the etchant for this layer does not attack the underlying substrate material to any great extent.

The first intermetal insulating layer 55 may be formed of a low dielectric constant organic material such as, for example, polyimide, spin-on-polymers (SOP), flare, polyarylethers, parylene, polytetrafluoroethylene, benzocyclobutene (BCB) or SILK. Alternatively, the first intermetal insulating layer 55 may be formed of an inorganic material with a low dielectric constant such as, for example, fluorinated silicon oxide (FSG), hydrogen silsesquioxane (HSQ) or NANOGLASS. The present invention is not limited, however, to the above-listed materials and other organic and inorganic materials with low dielectric constant may be used, especially ones whose dielectric constant (k) is lower than that of silicon oxide ($SiO_2$), which is approximately 4.0.

Figure 7:
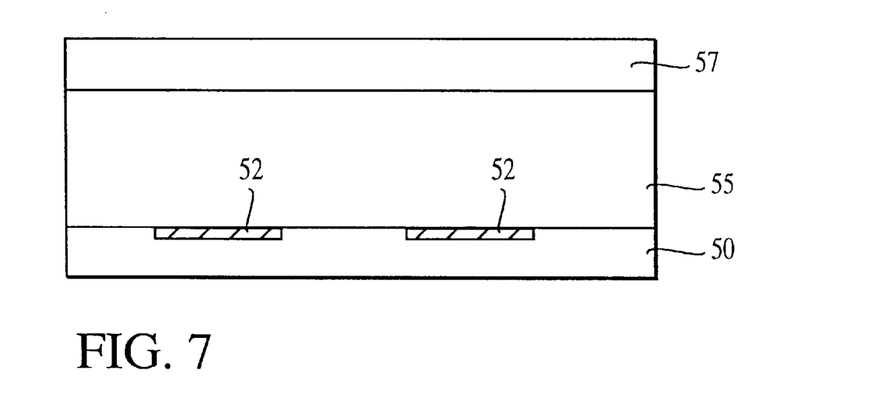
FIG. 7 is a cross sectional view of the semiconductor device of FIG. 6 at a subsequent stage of production.

Next, as illustrated in FIG. 7, a thin second intermetal insulating layer 57 is formed overlying the first intermetal insulating layer 55 and below a metal layer that will be formed subsequently. The thin second intermetal insulating layer 57 may be formed, for example, by spin coating to a thickness of about 100 Angstroms to about 2,000 Angstroms, more preferably of about 500 Angstroms. Following deposition, the second intermetal insulating layer 57 is cured at a predefined temperature, depending, again, on the nature and specific characteristics of the insulating material. Other deposition methods, such as the ones mentioned above with reference to the formation of the first intermetal insulating layer 55, may be used also.

The material of choice for the second intermetal insulating layer 57 is also a low dielectric constant organic or inorganic material, with a dielectric constant lower than 4.0, as the ones listed above with reference to the first intermetal insulating layer 55. However, as discussed in more detail below, the two insulating layers 55, 57 are preferably compatible with each other in the sense that each of them may be capable of withstanding stress levels which will be later induced as a result of various processes and during the use of the IC device. Further, each material should be capable of withstanding the maximum temperature required in the processing of the other one.

In a preferred embodiment of the present invention, two compatible materials for the two intermetal insulating layers 55, 57 are SILK (organic material with k of approximately 2.65 at 100 kHz) and NANOGLASS (inorganic material with k of approximately 3.5 at 100 kHz). Both SILK and NANOGLASS can be applied by spin coating and both are capable of withstanding similar stress levels, as well as the processing temperature of each other. Further, both SILK and NANOGLASS may be individually etched by a respective etchant which, while readily etching one insulating material, will have only a very small, negligible etch rate for the other insulating material.

Another example of two compatible low dielectric constant materials is a foamed polyimide (as the organic component with k in the range of 2.0 to 3.0, depending upon the degree of porosity) and hydrogen silsesquioxane (HSQ) (as the inorganic component with k in the range of 2.3 to 3.0). However, other combinations may also be employed. Further, two low dielectric constant organic materials, as well as two low dielectric constant inorganic materials may be used also, as long as both materials retain compatible physical and chemical properties. Thus, the present invention is not limited to the use of the above-mentioned combinations, and other compatible low dielectric constant materials may be used also, especially those whose dielectric constants are lower than 4.0.

Figure 8:
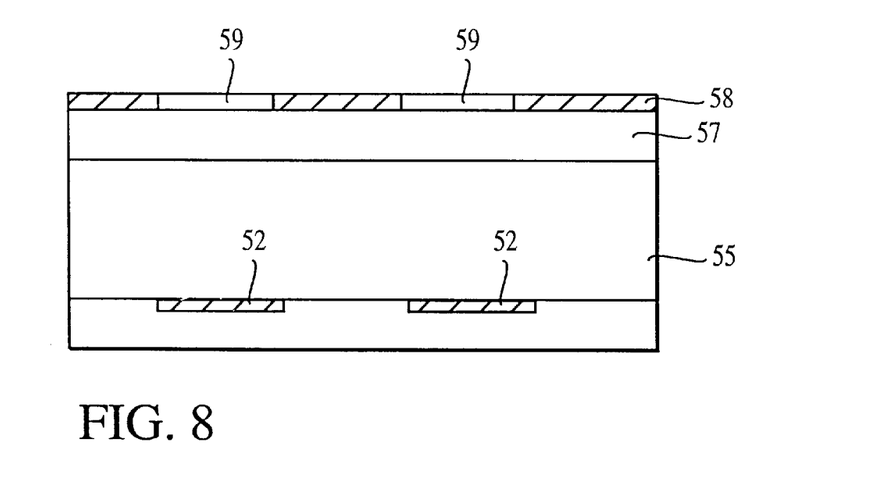
FIG. 8 is a cross sectional view of the semiconductor device of FIG. 7 at a subsequent stage of production.
Figure 9:
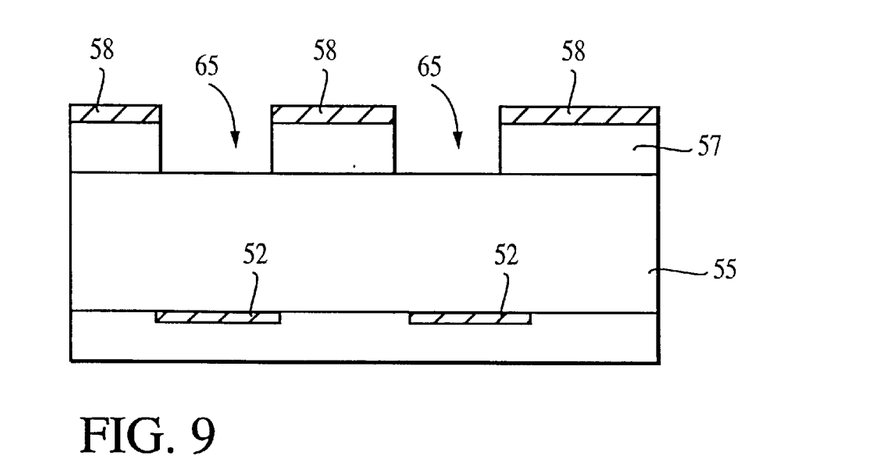
FIG. 9 is a cross sectional view of the semiconductor device of FIG. 8 at a subsequent stage of production.

Referring now to FIG. 8, a first photoresist layer 58 is formed over the second intermetal insulating layer 57. The first photoresist layer 58 is then patterned with a mask (not shown) having images of trench patterns 59 (FIG. 8). Thus, trenches 65 may be formed, as shown in FIG. 9, by etching through the photoresist layer 58 and into the second intermetal insulating layer 57 by using a second etchant. The second etchant may be selected in accordance with the characteristics of the second insulating material 57. The second etchant (not shown) selectively etches the second insulating material 57 until it reaches the first insulating material 55.

In the preferred embodiment of the present invention, which employs the SILK/NANOGLASS combination, the second etchant (for etching through the second intermetal insulating NANOGLASS layer 57) may contain a chlorine (Cl) plasma. The first etchant (which will selectively etch the first intermetal insulating SILK layer 55) may employ oxygen ($O_2$) plasma.

Figure 10:
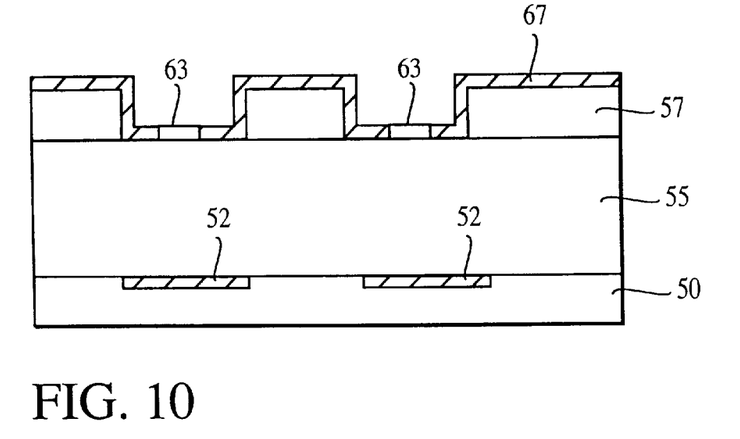
FIG. 10 is a cross sectional view of the semiconductor device of FIG. 9 at a subsequent stage of production.
Figure 13:
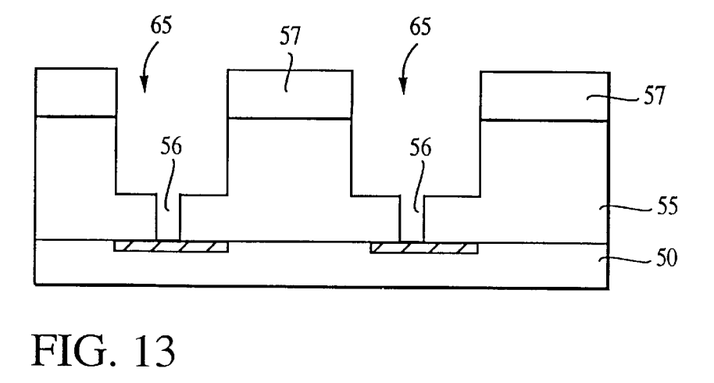
FIG. 13 is a cross sectional view of the semiconductor device of FIG. 12 at a subsequent stage of production.

After the formation of trenches 65 through the first intermetal insulating layer 55 and the removal of the first photoresist layer 58, vias 56 (FIG. 13) may be formed by photolithography. As such, a second photoresist layer 67 (FIG. 10) is formed over the first and second intermetal insulating layers 55, 57, and then patterned with a mask (not shown) having images of via patterns 63 (FIG. 10). The via patterns 63 are then etched by employing a timed etch into the second intermetal insulating layer 57 to form vias 56 (FIG. 11).

Figure 11:
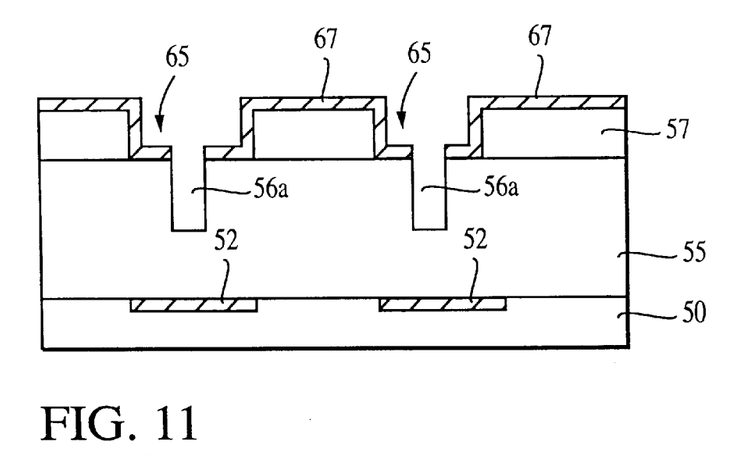
FIG. 11 is a cross sectional view of the semiconductor device of FIG. 10 at a subsequent stage of production.
Figure 12:
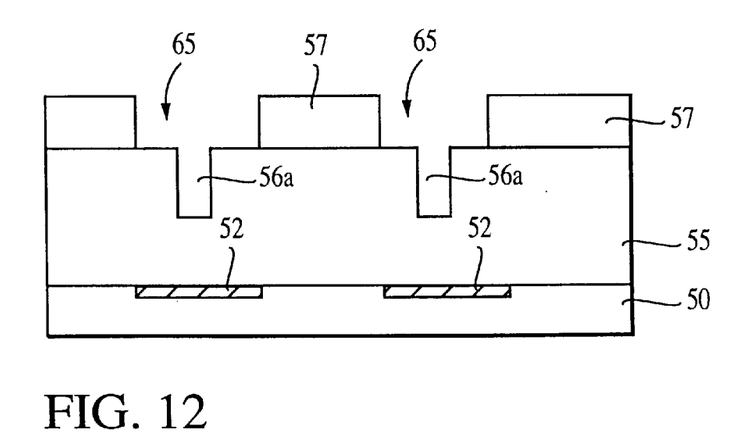
FIG. 12 is a cross sectional view of the semiconductor device of FIG. 11 at a subsequent stage of production.

The etching of vias 56 is accomplished by employing a time etching with a first etchant (which may include an $O_2$ plasma) to etch part of the first intermetal insulating layer 55, for example about half of the first insulating layer 55, to obtain vias 56a, as shown in FIG. 11. Subsequent to the formation of vias 56a, the second photoresist layer 67 is removed so that the first etchant is further used to completely etch through the first intermetal insulating layer 55 and complete the formation of vias 56 (FIG. 13) and define the trenches in layer 55, with the pattern, etched previously, in level 57 serving as a mask, see FIG. 13.

Next, a barrier layer, if needed, 72 (FIG. 14) is formed on the vias 56 and the trenches 65, as well as over the second intermetal insulating layer 57 by CVD, PVD, sputtering or evaporation, to a thickness of about 50 Angstroms to about 200 Angstroms, more preferably of about 100 Angstroms. Preferred materials for the barrier layer 72 are metals such as titanium (Ti), zirconium (Zr), tungsten (W), or hafnium (Hf), or metal compounds such as tantalum nitride (TaN), which may be applied by blanket deposition. If desired, the barrier layer 72 may be formed of refractory metal silicides such as TiSi or ZrSi. In any event, the barrier layer 72 suppresses the diffusion of the metal atoms from the subsequently deposited conductive material (FIG. 14), while offering a low resistivity and low contact resistance between the metal of the metal layer 52 and the barrier layer 72, and between the subsequently deposited conductive material (FIG. 14) and the barrier layer 72. As known in the art, the material for the barrier layer 72 is selected according to the type of metallurgy and/or insulators employed.

Figure 14:
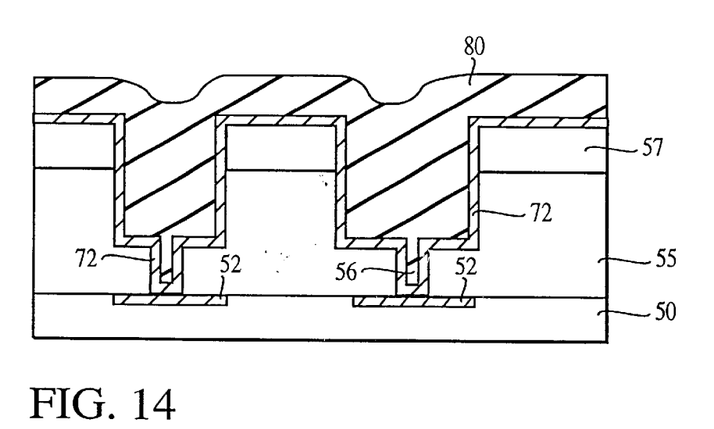
FIG. 14 is a cross sectional view of the semiconductor device of FIG. 13 at a subsequent stage of production.

As also illustrated in FIG. 14, a conductive material 80 is next deposited to fill in both vias 56 and trenches 65. In the preferred embodiment, the conductive material 80 comprises either copper, tungsten, aluminum, gold, silver or aluminum-copper and their alloys, but it must be understood that other materials may be used also. In any event, the conductive material 80 may be blanket deposited by a known PVD, CVD, or a combination of these techniques to fill in both vias 56 and trenches 65. Alternatively, the conductive material 80 may be deposited by a plating technique.

Figure 15:
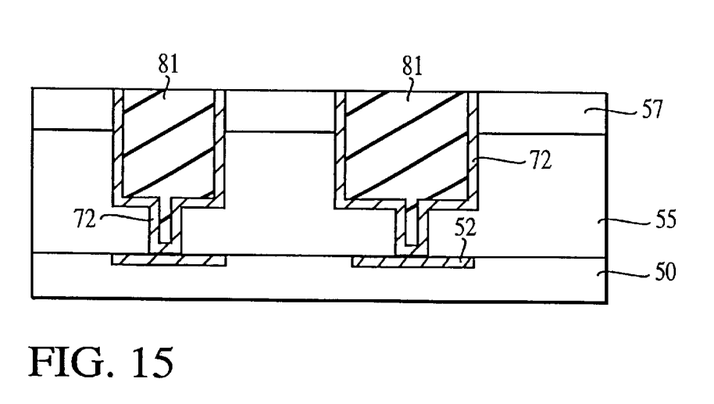
FIG. 15 is a cross sectional view of the semiconductor device of FIG. 14 at a subsequent stage of production.

If necessary, a second barrier layer may be deposited on top of the conductive material 80. For example, in the case of aluminum or aluminum-copper alloy structures, a layer of titanium (Ti) or zirconium (Zr) is often used both above and below the aluminum alloy layer to improve electromigration resistance of the lines. In any event, after the deposition of the conductive material 80, excess metal formed above the surface of the second insulating material 57 may be removed by either an etching or a polishing technique to form first metallization structures 81 illustrated in FIG. 15. In a preferred embodiment of the present invention, chemical mechanical polishing (CMP) is used to polish away excess conductive material above the second insulating material 57 and the trench level. This way, the second insulating material 57 acts as a polishing stop layer when CMP is used.

Figure 23:
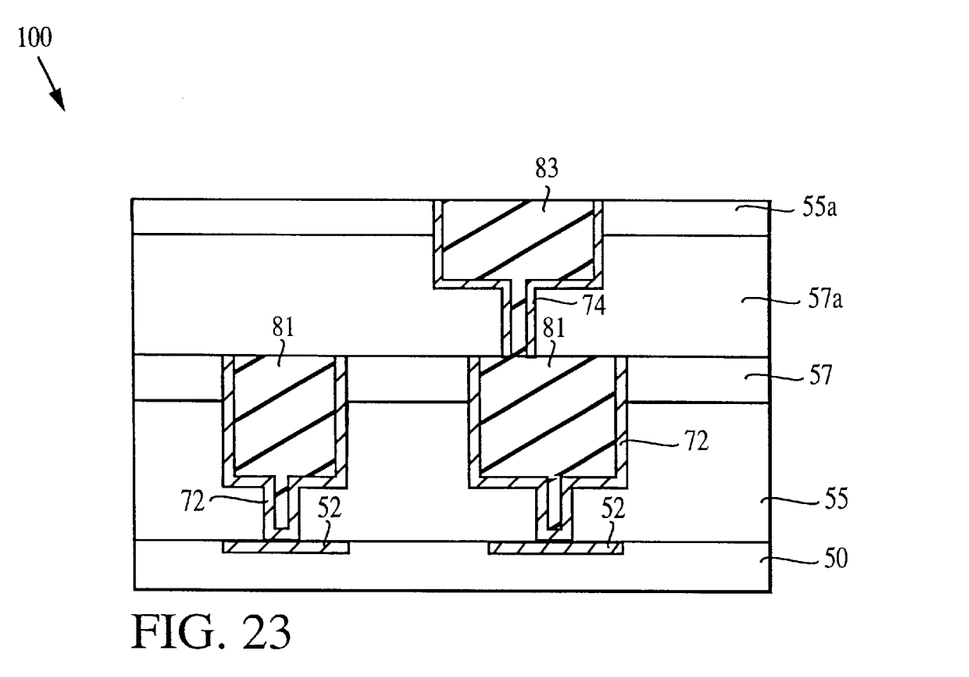
FIG. 23 is a cross sectional view of a semiconductor device of FIG. 22 at a subsequent stage of production.

Subsequent the formation of the first metallization structures 81 (FIG. 15), a second timed etch is employed to complete the process of forming a second damascene interconnect structure 100 (FIG. 23). As such, a second pair of intermetal insulating layers of low dielectric constant materials is formed over the first and second intermetal insulating layers 55, 57. In an exemplary embodiment of the invention, the second pair of intermetal insulating layers includes same low dielectric constant materials as those forming the first and second intermetal insulating layers 55, 57. For example, in the SILK/NANOGLASS combination described above, the second pair of intermetal insulating layers will comprise first a layer of NANOGLASS and then a layer of SILK This embodiment is exemplified in more detail below.

Figure 16:
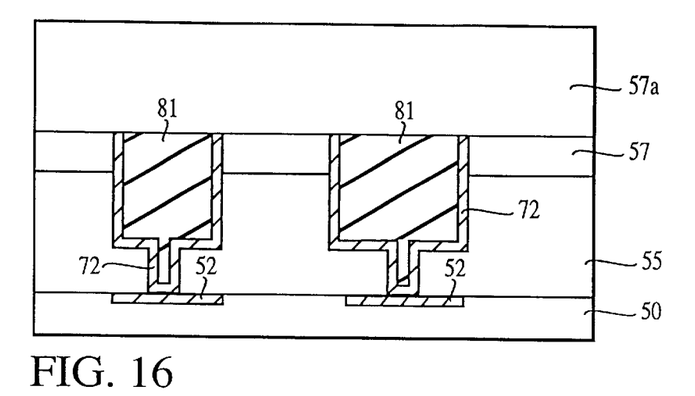
FIG. 16 is a cross sectional view of the semiconductor device of FIG. 15 at a subsequent stage of production.

Accordingly, as illustrated in FIG. 16, a third intermetal insulating layer 57a is formed overlying the first metallization structures 81 and portions of the second intermetal insulating layer 57. In a preferred embodiment of the present invention, the third intermetal insulating layer 57a is formed of a low dielectric constant material similar to that of the second intermetal insulating layer 57. Thus, in the exemplary embodiment of the invention which employs the SILK/NANOGLASS combination described above, the third intermetal insulating layer 57a may be formed of NANOGLASS and may be blanket deposited by spin coating to a thickness of about 4,000 Angstroms to 30,000

Angstroms, more preferably about 12,000 to 20,000 Angstroms. The third intermetal insulating layer 57a may be also cured at a predefined temperature, depending on the nature of the material.

Figure 17:
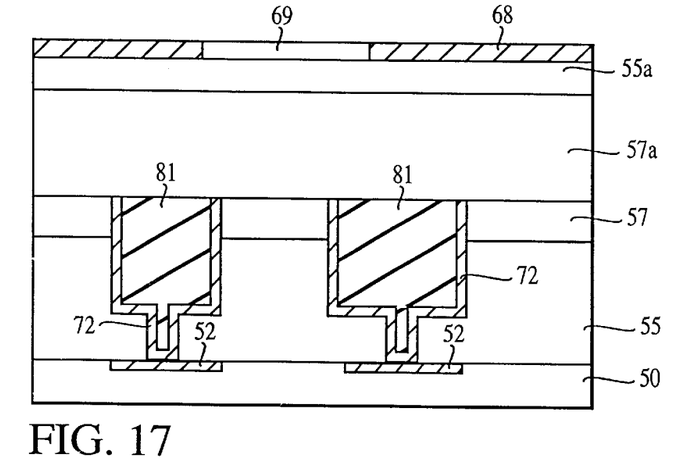
FIG. 17 is a cross sectional view of the semiconductor device of FIG. 16 at a subsequent stage of production.

Next, as illustrated in FIG. 17, a thin fourth intermetal insulating layer 55a is formed overlying the third intermetal insulating layer 57a. The thin fourth intermetal insulating layer 55a may be formed, for example, by spin coating to a thickness of about 100 Angstroms to about 2,000 Angstroms, more preferably of about 500 Angstroms. Following deposition, the fourth intermetal insulating layer 55a is cured at a predefined temperature, depending, again, on the nature and specific characteristics of the insulating material. Other deposition methods, such as the ones mentioned above with reference to the formation of the intermetal insulating layers 55, 57, 57a may be used also.

The material of choice for the fourth intermetal insulating layer 57a is also a low dielectric constant organic or inorganic material, with a dielectric constant lower than 4.0, as the ones listed above with reference to the first and second intermetal insulating layers 55, 57. For example, in the exemplary embodiment of the invention which employs the SILK/NANOGLASS combination described above, the fourth intermetal insulating layer 55a may be formed of SILK, which is the material of choice for the first insulating layer 55.

Figure 18:
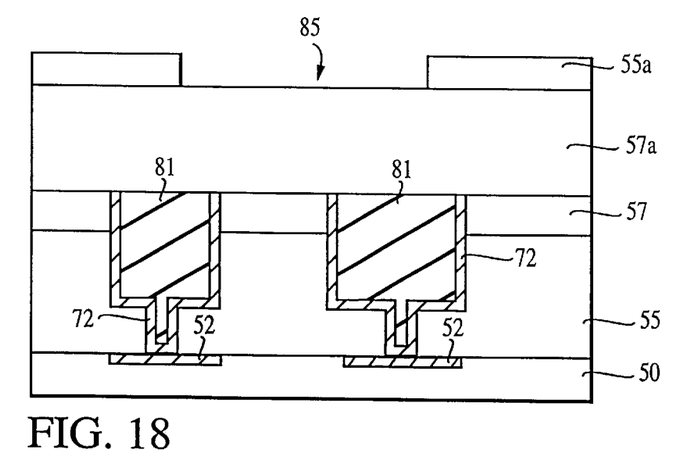
FIG. 18 is a cross sectional view of the semiconductor device of FIG. 17 at a subsequent stage of production.

Subsequent to the formation of the third and fourth intermetal insulating layers 57a, 55a, the processing steps for the formation of a second metallization structure 83 (FIG. 23) proceed according to those described above with reference to the formation of the first metallization structure 81 (FIGS. 8–15). As such, a third photoresist layer 68 (FIG. 17) is formed over the fourth intermetal insulating layer 55a, and then patterned with a mask (not shown) having images of a trench pattern 69 (FIG. 17). Thus, a pattern of the trench 85 may be formed, as shown in FIG. 18, by etching through the photoresist layer 68 and into the fourth intermetal insulating layer 55a. The etching may be accomplished by employing the first etchant previously used for the etching of vias 56 (FIG. 13) through the first intermetal insulating layer 55. For example, in the preferred embodiment of the present invention which employs the SILK/NANOGLASS combination, the first etchant for selectively etching the first and fourth intermetal insulating SILK layers 55, 57 may employ oxygen ($O_2$) plasma.

Figure 19:
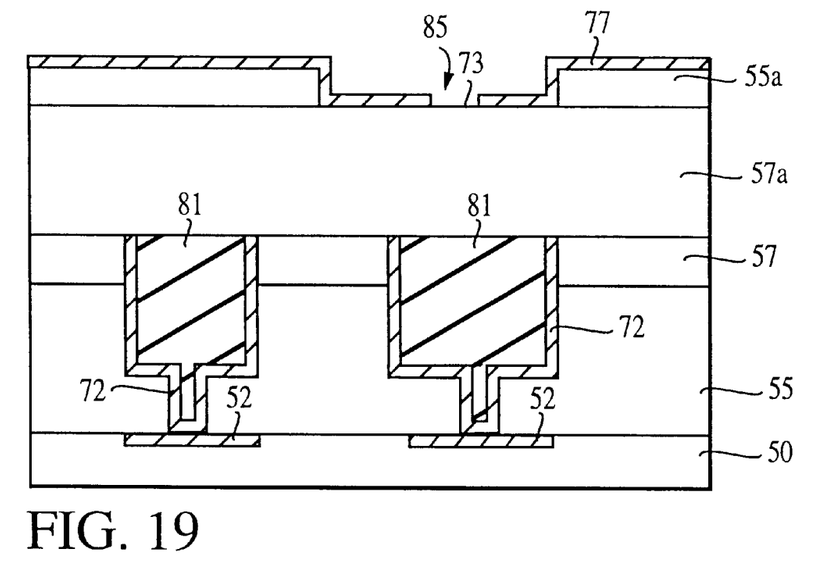
FIG. 19 is a cross sectional view of a semiconductor device of FIG. 18 at a subsequent stage of production.
Figure 21:
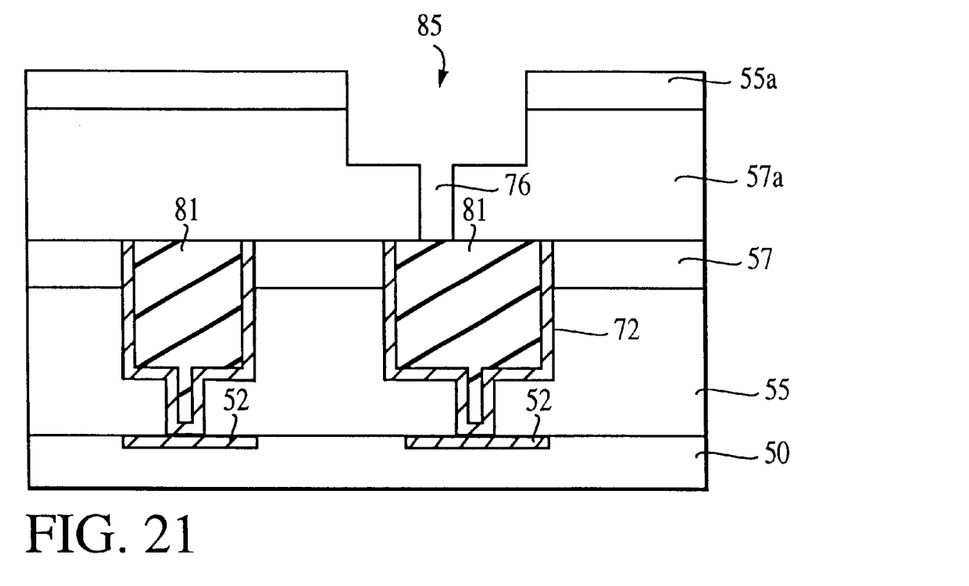
FIG. 21 is a cross sectional view of a semiconductor device of FIG. 20 at a subsequent stage of production.

After the formation of a pattern of the trench 85 through the fourth intermetal insulating layer 55a and the removal of the third photoresist layer 68, vias 76 (FIG. 21) may be formed by photolithography, in ways similar to those for the formation of vias 56 (FIGS. 10–13). Accordingly, a fourth photoresist layer 77 (FIG. 19) is formed over the third and fourth intermetal insulating layers 57a, 55a and then patterned with a mask (not shown) having images of via patterns 73 (FIG. 19). The via patterns 73 are then etched by employing a second time etching into the third intermetal insulating layer 57a to form vias 76 of FIG. 20.

Figure 20:
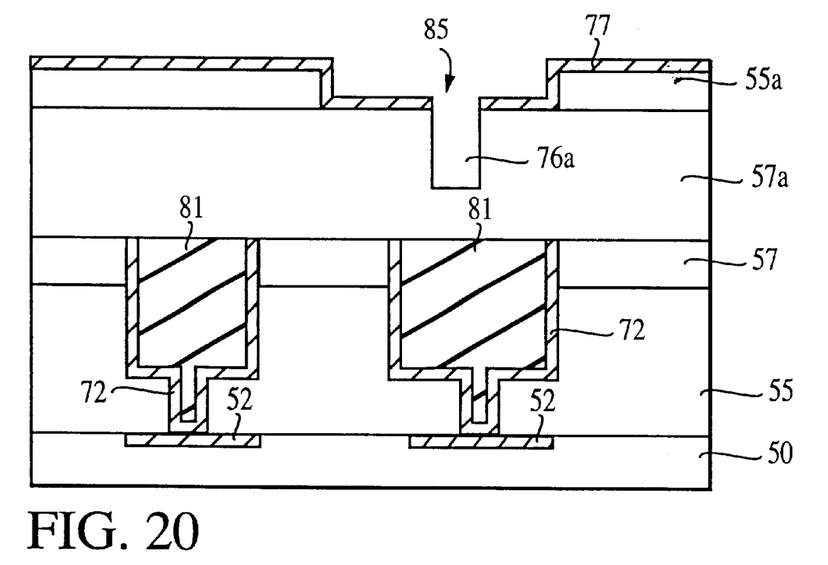
FIG. 20 is a cross sectional view of a semiconductor device of FIG. 19 at a subsequent stage of production.

The etching of vias 76 is accomplished by employing a time etching with the second etchant (which may include a chlorine plasma) to etch part of the third intermetal insulating layer 57a, for example about half of the third insulating layer 57a, to obtain vias 76a, as shown in FIG. 20. Subsequent to the formation of vias 76a, the fourth photoresist layer 77 is removed so that the second etchant is further used to completely etch through the third intermetal insulating layer 57a and complete the formation of vias 76 (FIG. 21) and define the trenches in layer 57a.

Figure 22:
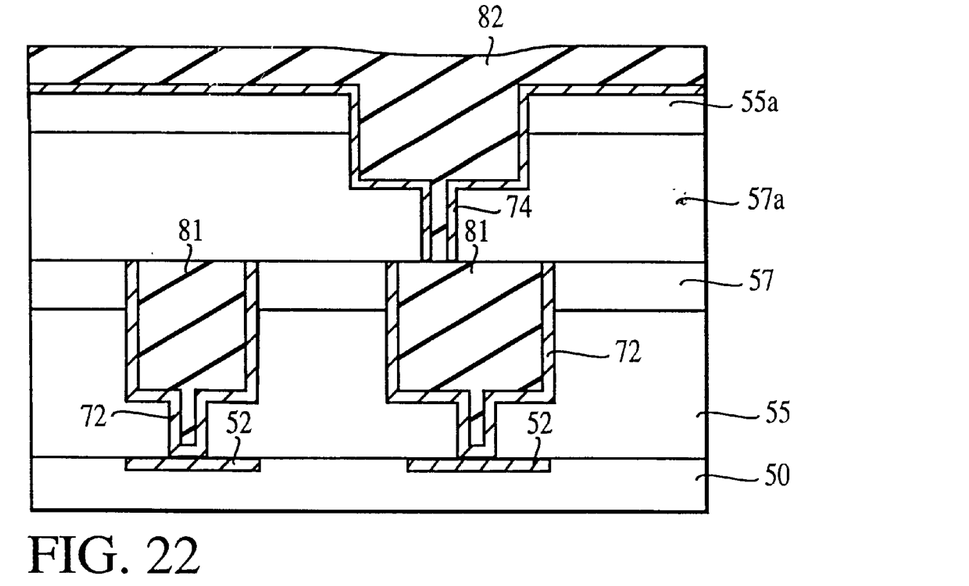
FIG. 22 is a cross sectional view of a semiconductor device of FIG. 21 at a subsequent stage of production.

A barrier layer 74 is next formed on the vias 76 and the third intermetal insulating layer 57a, as shown in FIG. 22. The barrier layer 74 may be formed by CVD, PVD, sputtering or evaporation, to a thickness of about 50 Angstroms to about 200 Angstroms, more preferably of about 100 Angstroms. Preferred materials for the barrier layer 74 are metals such as titanium (Ti), zirconium (Zr), tungsten (W), or hafnium (Hf), metal compounds such as tantalum nitride (TaN), refractory metal silicides such as titanium silicide (TiSi) or zirconium silicide (ZrSi), among others.

Referring now to FIG. 22, a conductive material 82 is deposited to fill in both vias 76 and trench 85. The conductive material 82 may be formed of copper, aluminum, or tungsten, among others, and may be deposited or plated, depending on the desired method of formation. In any event, excess metal formed above the surface of the fourth intermetal insulating layer 55a is removed by either an etching or a polishing technique to form a second metallization structure 83 (FIG. 23) and to complete the formation of a damascene interconnect structure 100 illustrated in FIG. 23. In a preferred embodiment of the present invention, chemical mechanical polishing (CMP) is used to polish away excess conductive material above the fourth insulating material 55a and the trench level. This way, the fourth insulating material 55a acts as a polishing stop layer when CMP is used.

Although only two damascene interconnect structures 100 are shown in FIG. 23, it must be readily apparent to those skilled in the art that in fact any number of such damascene interconnect structures may be formed on the substrate 50. Further, although the exemplary embodiment described above refers to only two pairs of low dielectric constant insulating layers, it must be understood that any number of such pairs may be employed, depending on the desired level of metallization.

Also, although the exemplary embodiment described above refers to the formation of a damascene interconnect structure 100, the invention is further applicable to other types of metallization structures, for example, single, double or triple damascene structures, or subtractive metallization structures, depending on the number of low dielectric constant insulating layers formed over the substrate 50. Further, the invention is not limited to the use of SILK and NANOGLASS, but may be used with other compatible organic and/or inorganic materials with dielectric constants lower than 4.0.

In addition, further steps to create a functional memory cell may be carried out. Thus, additional multilevel interconnect layers and associated dielectric layers could be formed to create operative electrical paths from the damascene interconnect structure 100 to a source/drain region (not shown) of the substrate 50.

Figure 24:
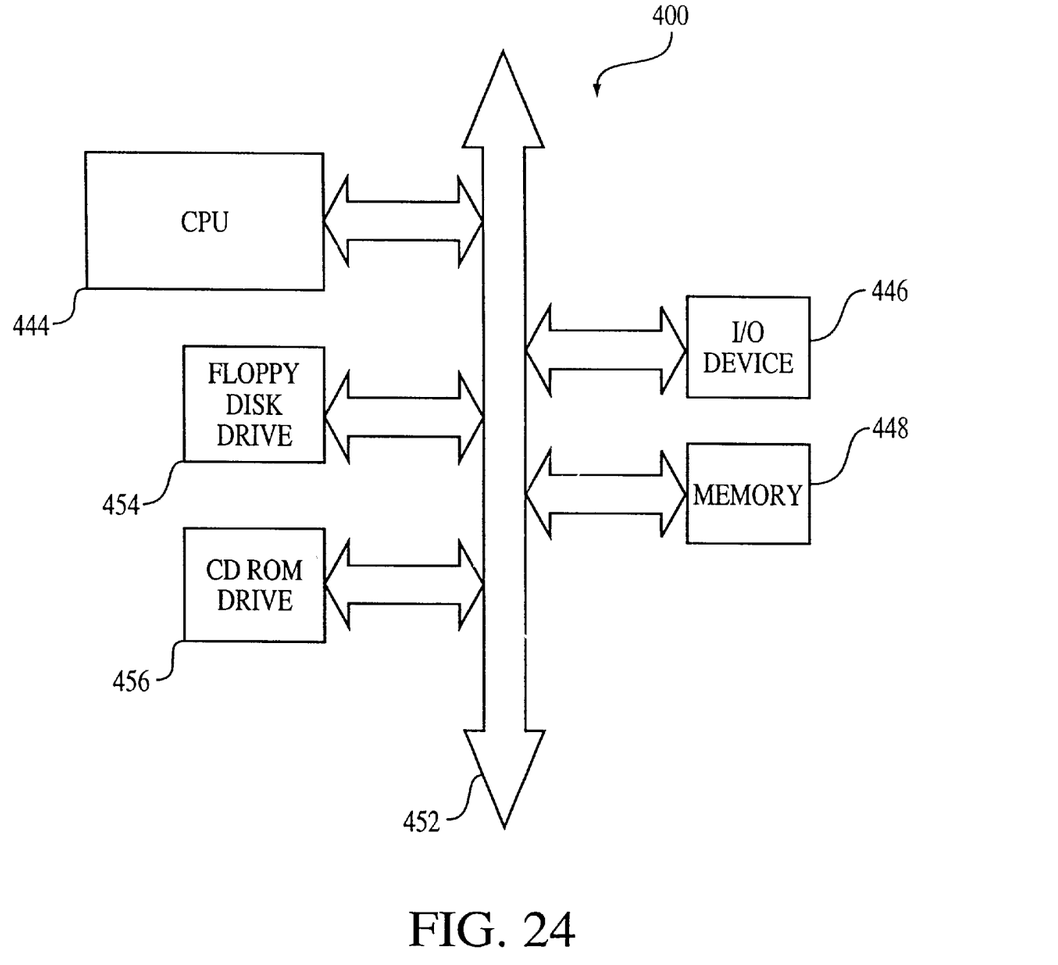
FIG. 24 illustrates a computer system having a memory cell with a dual damascene structure according to the present invention.

A typical processor-based system 400 which includes a memory circuit 448, for example a DRAM, containing interconnect structures according to the present invention is illustrated in FIG. 24. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes one or more damascene interconnect structures 100. If desired, the memory 448 may be combined with the processor, e.g. CPU 444, in a single integrated circuit.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming an interconnect structure, said method comprising the steps of:

forming a second opening through a SILK layer which is provided over a NANOGLASS layer;

time etching a first opening through said NANOGLASS insulating layer, said first opening being in communication with said second opening; and providing a first conductive material in said first and second openings.

2. The method of claim 1 further comprising the steps of:

forming a fourth opening through a fourth insulating layer which is provided over a third insulating layer, said third insulating layer being formed over said conductive material, said third and fourth insulating layers comprising a low dielectric constant material;

time etching a third opening through said third insulating layer, said third opening being in communication with said fourth opening; and providing a second conductive material in said third and fourth openings.

3. The method of claim 2, wherein said third and fourth insulating layers are formed of a low dielectric constant inorganic material.

4. The method of claim 3, wherein said third and fourth insulating layers are formed of an organic material.

* * * * *